US012785700B2

(12) United States Patent
Yang et al.

(10) Patent No.: US 12,785,700 B2
(45) Date of Patent: Nov. 3, 2026

(54) CHARGE PUMP, PHASE-LOCKED LOOP, RADAR SENSOR, AND ELECTRONIC DEVICE

(71) Applicant: CALTERAH SEMICONDUCTOR TECHNOLOGY (SHANGHAI) CO., LTD, Shanghai (CN)

(72) Inventors: Jianwei Yang, Shanghai (CN); Wenting Zhou, Shanghai (CN)

(73) Assignee: CALTERAH SEMICONDUCTOR TECHNOLOGY (SHANGHAI) CO., LTD, Shanghai (CN)

( * ) Notice: Subject to any disclaimer, the term of this patent is extended or adjusted under 35 U.S.C. 154(b) by 0 days.

(21) Appl. No.: 18/988,112

(22) Filed: Dec. 19, 2024

(65) Prior Publication Data

US 2025/0125809 A1 Apr. 17, 2025

Related U.S. Application Data

(63) Continuation of application No. PCT/CN2023/125244, filed on Oct. 18, 2023.

(30) Foreign Application Priority Data

Oct. 25, 2022 (CN) ........................ 202211313865.4

(51) Int. Cl.
*H03L 7/089* (2006.01)
*H03L 7/093* (2006.01)
(Continued)

(52) U.S. Cl.
CPC ............ *H03L 7/0893* (2013.01); *H03L 7/093* (2013.01); *H03L 7/099* (2013.01); *H03L 7/18* (2013.01)

(58) Field of Classification Search
CPC ....... H03L 7/0893; H03L 7/093; H03L 7/099; H03L 7/18
See application file for complete search history.

(56) References Cited

U.S. PATENT DOCUMENTS 6,104,771 A * 8/2000 Soda ........................ H03L 7/10 375/376
6,430,244 B1 * 8/2002 Ryu .................... H03D 13/004 375/376
(Continued)

FOREIGN PATENT DOCUMENTS

CN 1487670 A 4/2004
CN 101159433 A 4/2008
(Continued)

OTHER PUBLICATIONS

Manas Kumar Hati et al., Phase noise analysis of proposed PFD and CP switching circuit and its advantages over various PFD/CP switching circuits in phase-locked loops, Integration, the VLSI journal 63 (2018) 115-129, 15 pages.
(Continued)

*Primary Examiner* — Thomas J. Hiltunen
*Assistant Examiner* — Khareem E Almo
(74) *Attorney, Agent, or Firm* — BROOKS KUSHMAN P.C.

(57) ABSTRACT

A charge pump, a phase-locked loop, a radar sensor, and an electronic device. The charge pump is applicable to the phase-locked loop. The charge pump comprises a discharging circuit and a charging circuit, both of which are connected to an output end of the charge pump. The discharging circuit reduces a current of the output terminal under control of a first control signal, the charging circuit increases it under control of a second control signal, the first control signal and the second control signal being corresponding to error signals between the two clock signals. The charge
(Continued)

pump further comprises a voltage control circuit connected to a first node in the discharging circuit and/or a second node in the charging circuit to maintain the locked state of the phase-locked loop by controlling voltages of corresponding nodes, the first node and the second node being both connected to the output end.

17 Claims, 6 Drawing Sheets

(51) Int. Cl.
*H03L 7/099* (2006.01)
*H03L 7/18* (2006.01)

(56) References Cited

U.S. PATENT DOCUMENTS

| | | | | |
|---|---|---|---|---|
| 6,566,920 | B1 * | 5/2003 | Kim | H03L 7/1075 327/147 |
| 6,717,446 | B1 | 4/2004 | Vu | |
| 8,487,677 | B1 * | 7/2013 | Xue | H03L 7/089 327/148 |
| 8,598,955 | B2 * | 12/2013 | Xue | H03L 7/099 327/156 |
| 11,115,032 | B1 | 9/2021 | Lachhwani et al. | |
| 2003/0071689 | A1 * | 4/2003 | Magazzu | H03L 7/0891 331/16 |
| 2005/0280453 | A1 * | 12/2005 | Hsieh | H03L 7/093 327/156 |
| 2006/0097795 | A1 | 5/2006 | Sohn | |
| 2008/0191783 | A1 * | 8/2008 | Sudjian | H03L 7/0896 327/536 |
| 2019/0097640 | A1 * | 3/2019 | Nagarajan | H03L 7/22 |

FOREIGN PATENT DOCUMENTS

| | | | |
|---|---|---|---|
| CN | 103297042 | A | 9/2013 |
| CN | 108449085 | A | 8/2018 |
| CN | 114301451 | A | 4/2022 |
| CN | 114826225 | A | 7/2022 |
| WO | 2019169607 | A1 | 9/2019 |

OTHER PUBLICATIONS

European Search Report for EP Application No. 23881715.9-1201/4525310, dated Sep. 30, 2025, 5 pages.
European Examination Report for EP Application No. 23881715.9-1201/4525310, dated Oct. 10, 2025, 13 pages.
International Search Report for International Application No. PCT/CN2023/125244, dated Jan. 29, 2024, 6 pages (including English translation).
CNIPO First Office Action for CN Application No. 202211313865.4, dated May 29, 2026, 14 pages (including English translation).

* cited by examiner

CHARGE PUMP, PHASE-LOCKED LOOP, RADAR SENSOR, AND ELECTRONIC DEVICE

CROSS-REFERENCE TO RELATED APPLICATIONS

This application is a continuation of International PCT Application No. PCT/CN2023/125244, filed on Oct. 18, 2023, which claims priority to Chinese Patent Application No. 202211313865.4 filed on Oct. 25, 2022, the disclosures of which are hereby incorporated herein by reference in their entireties.

TECHNICAL FIELD

Embodiments of the present disclosure relate to, but are not limited to, the technical field of frequency modulated continuous wave, and particularly relate to a charge pump, a phase-locked loop, a radar sensor, and an electronic apparatus.

BACKGROUND

In a radar and wireless communication system, a signal quality of Frequency Modulated Continuous Wave (FMCW) has a decisive influence on the whole system. A frequency modulated continuous wave signal is generated by a phase-locked loop (PLL) in the system, so the quality of the frequency modulated continuous wave signal generated by PLL is very important to the performance of the system. A charge pump structure is added between a phase frequency detector and a loop filter in a Charge Pump-PLL (CP-PLL). By driving a capacitor in the loop filter, an integrator is formed, which can increase the loop gain to extremely large.

SUMMARY

The following is a summary of subject matters described in the present disclosure in detail. This summary is not intended to limit the scope of protection of the claims.

Embodiments of the present disclosure provide a charge pump, a phase-locked loop, a signal transmission apparatus, a radar sensor, and an electronic apparatus.

In one aspect, an embodiment of the present disclosure provides a charge pump applied in a phase-locked loop, wherein the phase-locked loop enters a locked state when two input clock signals are on a same frequency and in a same phase. The charge pump includes: a discharging circuit and a charging circuit, both the discharging circuit and the charging circuit are connected to an output terminal of the charge pump, the discharging circuit decreases a current of the output terminal under control of a first control signal, the charging circuit increases the current of the output terminal under control of a second control signal, the first control signal and the second control signal correspond to error signals between the two clock signals, and the charge pump further includes a voltage control circuit.

The voltage control circuit is connected to a first node in the discharging circuit and/or a second node in the charging circuit to maintain the locked state of the phase-locked loop by controlling a voltage of a corresponding node; wherein both the first node and the second node are connected to the output terminal.

In an exemplary embodiment, the discharging circuit includes a first node, and a first switch transistor positioned between the first node and the output terminal. The voltage control circuit includes a first control circuit, and the first control circuit controls a turned-on speed of the first switch transistor by adjusting a voltage of the first node when the discharging circuit does not decrease the current of the output terminal.

In an exemplary embodiment, the charging circuit includes a second node, and a second switch transistor positioned between the second node and the output terminal. The voltage control circuit includes a second control circuit connected to the second node, and the second control circuit controls a turned-on speed of the second switch transistor by adjusting a voltage of the second node when the charging circuit does not increase the current of the output terminal.

In an exemplary embodiment, the first control circuit includes a first charge buffer and a first control transistor in series, the first charge buffer stores charges, an input terminal of the first control transistor is connected to an output terminal of the first charge buffer, an output terminal of the first control transistor is connected to the first node, a control terminal of the first control transistor is configured to receive the first control signal, and the first control transistor acts as a switch to discharge the charges stored in the first charge buffer to the first node.

The second control circuit includes a second charge buffer and a second control transistor in series, the second charge buffer stores charges, an input terminal of the second control transistor is connected to an output terminal of the second charge buffer, an output terminal of the second control transistor is connected to the second node, a control terminal of the second control transistor is configured to receive the second control signal, and the second control transistor acts as a switch to discharge the charges stored in the second charge buffer to the second node.

In an exemplary embodiment, the first control circuit further includes a first current source and a first adjustable resistor in series, an input terminal of the first current source is connected to a power supply voltage terminal, an output terminal of the first current source is connected to a first terminal of the first adjustable resistor, a second terminal of the first adjustable resistor is connected to a ground terminal, a third terminal of the first adjustable resistor is connected to a first input terminal of the first charge buffer, a second input terminal of the first charge buffer is connected to the output terminal of the first charge buffer, and the output terminal of the first charge buffer is connected to the input terminal of the first control transistor.

The second control circuit further includes a second current source and a second adjustable resistor in series, an input terminal of the second current source is connected to a power supply voltage terminal, an output terminal of the second current source is connected to a first terminal of the second adjustable resistor, a second terminal of the second adjustable resistor is connected to the ground terminal, a third terminal of the second adjustable resistor is connected to a first input terminal of the second charge buffer, a second input terminal of the second charge buffer is connected to the output terminal of the second charge buffer, and the output terminal of the second charge buffer is connected to the input terminal of the second control transistor.

In an exemplary embodiment, the voltage control circuit includes a charge buffer and a control transistor in series, the charge buffer stores charges, and an input terminal of the control transistor is connected to an output terminal of the charge buffer.

An output terminal of the control transistor is connected to the first node, a control terminal of the control transistor is configured to receive the first control signal, and the control transistor acts as a switch to discharge the charges stored in the charge buffer to the first node; or an output terminal of the control transistor is connected to the second node, a control terminal of the control transistor is configured to receive the second control signal, and the control transistor acts as a switch to discharge the charges stored in the charge buffer to the second node.

In an exemplary embodiment, the voltage control circuit further includes a current source and an adjustable resistor in series, an input terminal of the current source is connected to a power supply voltage terminal, an output terminal of the current source is connected to a first terminal of the adjustable resistor, a second terminal of the adjustable resistor is connected to a ground terminal, a third terminal of the adjustable resistor is connected to a first input terminal of the charge buffer, and a second input terminal of the charge buffer is connected to the output terminal of the charge buffer.

In an exemplary embodiment, net charges output by the charge pump during a locked period of the phase-locked loop are 0 or approximately 0.

In an exemplary embodiment, the voltage control circuit adjusts turned-on speeds of the charging circuit and/or the discharging circuit such that the charging circuit and the discharging circuit are simultaneously turned on.

In another aspect, an embodiment of the present disclosure provides a phase-locked loop including a phase frequency detector, a charge pump, a loop filter, an oscillator, and a divider. The phase frequency detector is respectively connected to an input terminal of the phase-locked loop and an output terminal of the divider to receive two clock signals, and an output terminal of the phase frequency detector is connected to an input terminal of the charge pump; an output terminal of the charge pump is connected to an input terminal of the loop filter, an output terminal of the loop filter is connected to an input terminal of the oscillator, and an output terminal of the oscillator is connected to an input terminal of the divider; wherein the charge pump includes the charge pump according to any one of the above embodiments.

In an exemplary embodiment, the divider converts an output signal fout of the phase-locked loop into one clock signal DIVCLK of clock signals received by the phase frequency detector according to a fixed frequency division ratio N; or the divider is connected to a modulator to convert an FMCW signal output by the phase-locked loop into one clock signal DIVCLK of clock signals received by the phase frequency detector by using an adjustable frequency division ratio N output by the modulator; wherein the charge pump is configured to maintain a locked state of the phase-locked loop during operation of either divider.

In yet another aspect, an embodiment of the present disclosure provides a radar sensor including a signal receiver, a signal transmitter, and a clock source.

The signal transmitter receives an output signal from the clock source, and transmits the output signal through a transmitting antenna to form a detection signal wave.

The signal receiver receives an echo formed by reflection of the detection signal wave by a target object by using a receiving antenna, and performs a down conversion processing on the echo to output an intermediate frequency signal; wherein the clock source includes the phase-locked loop according to any one of the above embodiments to generate the output signal.

In yet another aspect, an embodiment of the present disclosure provides an electronic apparatus, including the phase-locked loop or the radar sensor according to any one of the above embodiments.

After the drawings and detailed description are read and understood, other aspects can be understood.

BRIEF DESCRIPTION OF THE DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure. Shapes and sizes of various components in the drawings do not reflect actual scales, but are only intended to schematically illustrate contents of the present disclosure.

DETAILED DESCRIPTION

Figure 1:
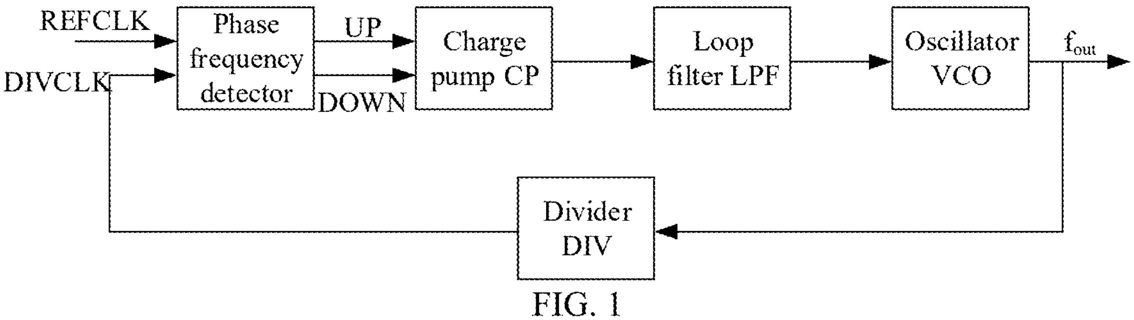
FIG. 1 is a schematic diagram of a structure of a phase-locked loop.

Multiple embodiments are described herein, but the description is exemplary rather than restrictive, and to those of ordinary skills in the art, there may be more embodiments and implementation solutions within the scope of the embodiments described herein. Although many possible feature combinations are shown in the drawings and discussed in the detailed description, many other combinations of disclosed features are possible. Unless expressly limited, any feature or element of any embodiment may be used in combination with, or may replace, any other feature or element in any other embodiment.

The present disclosure includes and contemplates combinations with features and elements known to those of ordinary skills in the art. The disclosed embodiments, features and elements of the present disclosure may also be combined with any conventional features or elements to form the technical solutions defined by the claims. Any feature or element of any embodiment may also be combined with features or elements from other technical solutions to form another technical solution defined by the claims. Accordingly, it should be understood that any of the features shown and/or discussed in the present disclosure may be implemented alone or in any suitable combination. Thus the embodiments are not subject to limitations other than those made in accordance with the appended claims and their equivalent substitutions. In addition, various modifications and changes can be made within the protection scope of the appended claims.

In embodiments of the present disclosure, the term "connection" may have the meaning of electrical coupling. As used herein, the term "connection" may mean that two elements or devices may be connected to each other directly or connected to each other via one or more intermediate elements or devices and via an electrical element, an electrical signal, or a mechanical element (e.g., but not limited to, a wire or a cable, depending on the practical application). "Connection" described herein includes, for example, a direct electrical connection, an inductive connection, or an opto-coupling connection, etc. For example, the electrical connection between two electrical devices is achieved using the connection mode used in semiconductor manufacturing process. For another example, the signal connection between two electrical devices is achieved using non-contact connection modes such as optocoupler components or inductance components. For another example, the connection mode between chip pins and slots is used to assist the electrical connection or signal connection between two electrical devices.

In the present specification, a transistor refers to an element including at least three terminals, that is, a gate electrode, a drain electrode, and a source electrode. The transistor has a channel region between the drain electrode (drain electrode terminal, a drain region, or a drain electrode) and the source electrode (a source electrode terminal, a source region, or a source electrode), and a current can flow through the drain electrode, the channel region, and the source electrode. Note that, in the present specification, the channel region refers to a region through which the current mainly flows. In the present specification, a gate electrode is a control terminal (or a control electrode), and a first electrode may be a drain electrode, a second electrode may be a source electrode, or the first electrode may be a source electrode, and the second electrode may be a drain electrode. Sometimes, the functions of the "source electrode" and the "drain electrode" may be interchanged with each other when a transistor having an opposite polarity thereto is used, or when a current direction changes during circuit operation, or the like. Therefore, in the present specification, the "source electrode" and the "drain electrode" may be interchanged with each other.

FIG. 1 is a system block diagram of a phase-locked loop (PLL), including a phase frequency detector (PFD), a charge pump (CP), a loop filter (Low Pass Filter, LPF), and an oscillator (a voltage controlled oscillator (VCO)) and a divider (DIV). The PLL is mainly configured to generate clock signals or Frequency Modulated Continuous Wave (FMCW) signals. As shown in FIG. 1, a reference clock signal REFCLK and a frequency division signal DIVCLK are input to the PFD. The PFD compares phases of the REFCLK and the DIVCLK to generate an error signal, also called a control signal (UP and DOWN), corresponding to a phase difference between the two signals. For example, when the DIVCLK lags behind the REFCLK, the PFD generates a high level signal UP, and when the DIVCLK is ahead the REFCLK, the PFD generates a low level signal DOWN, then the signal UP or the signal DOWN is input to the CP. Under control of this error signal, the CP adjusts an output current, and then the current is filtered by the LPF and converted into a voltage signal, and is output to the VCO. The VCO adjusts a frequency of an output oscillation signal according to a voltage of the received voltage signal. The oscillation signal is divided by a divider to obtain the DIVCLK. When the two input clock signals REFCLK and DIVCLK are on a same frequency and in a same phase, the PLL enters a locked state.

When the loop is locked, the phases of the REFCLK and the DIVCLK no longer change. If the CP and the LPF are ideal models, the clocks of the REFCLK and the DIVCLK are aligned, and the CP should no longer have a net charge to output to the LPF. If an linearity of the CP is not ideal (for example, when the net charge output by the CP is not 0 and the difference is large when the two CLKs are aligned), then when the PLL is locked, additional charges will still enter the LPF, such that the clocks of the REFCLK and the DIVCLK are not aligned, that is, there is a fixed phase difference between the two CLKs.

Figure 2:
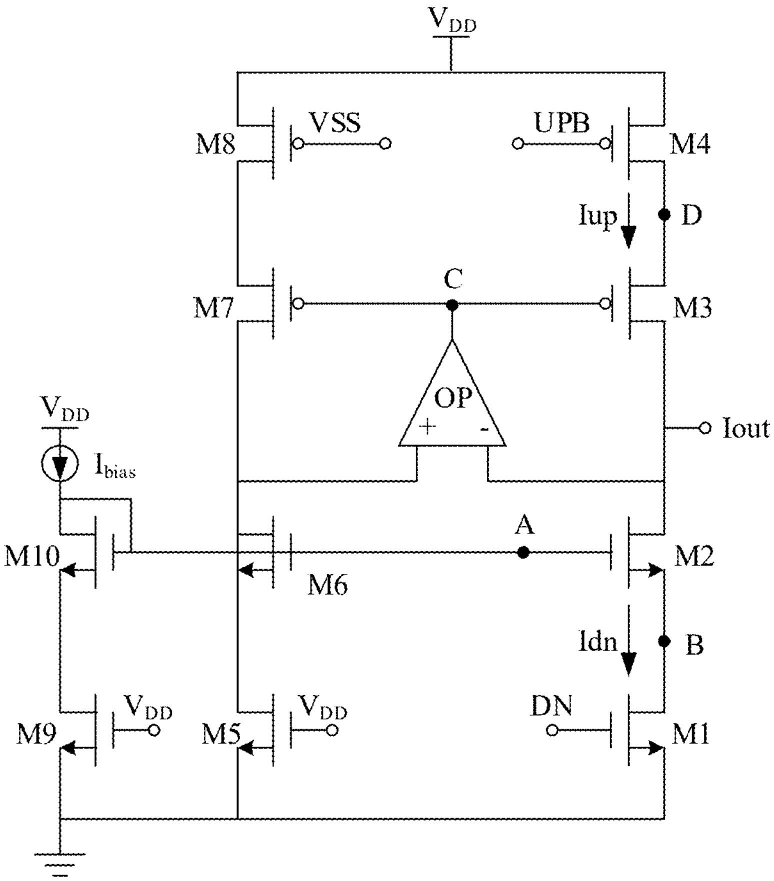
FIG. 2 is a schematic diagram of a circuit of a charge pump.
Figure 3:
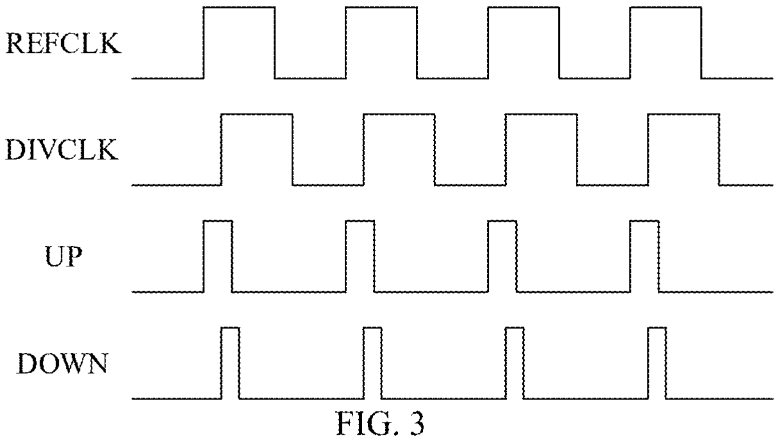
FIG. 3 is a timing diagram of a clock signal and a control signal.

According to the research of the inventors of the present application, the reasons why the REFCLK and the DIVCLK are not aligned and the net charge output by the CP is not 0 include that turned-on speeds of switches of PMOS (Positive Channel Metal Oxide Semiconductor) current mirror and NMOS (N-Metal-Oxide-Semiconductor) current mirror in the CP are inconsistent. FIG. 2 is a schematic diagram of a structure of a CP, and FIG. 3 is a timing diagram of two clock signals REFCLK and DIVCLK input by the PFD and control signals UP and DOWN output by the PFD. In FIG. 1, when the REFCLK arrives, the PFD will output a control signal UP to control a charge current Iup to charge the LPF; when the DIVCLK arrives, the PFD will output a control signal DOWN (abbreviated as a DN) to control a discharge current Idown (abbreviated as a Idn) to discharge the LPF. As shown in FIG. 3, when the REFCLK signal appears, that is, a rising edge of the REFLCK appears, the PFD generates a signal UP, which disappears after a delay, and when the DIVCLK signal appears, that is, a rising edge of the DIVCLK appears, the PFD generates a signal DOWN, which disappears after a delay. In FIG. 2, when the DN signal is at a high level, a gate of an M1 is at a high level and the M1 is turned on. At this time, a node B starts to discharge from a voltage greater than VA−Vthm2 (VA is a voltage of a node A, Vthm2 is an on threshold voltage of an M2. If the voltage of the node B is less than VA-Vthm2, the M2 will be turned on and continue to charge the node B) until the voltage of the node B is lower than VA-Vthm2. At this time, the M2 starts to be turned on and the Idn begins to increase until the voltage of the node B is close to 0 due to its discharging through M1. Therefore, a process of the Idn from 0 to a maximum value is a process in which the node B discharges from a voltage of VA-Vthm2 to close to 0. Similarly, it can be deduced that a process of the Iup from 0 to a maximum value is a process in which a node D is charged from a voltage less than VC+|Vthm3| to VDD. Since voltage values of VA and VC are not necessarily the same, and on threshold voltages of M2 and M3 are also different, parasitic capacitances of node B and node D are also different, so that charge and discharge speeds are different, resulting in different turned-on speeds of the M2 and the M3. When the turned-on speeds are different, even if the phases of the REFCLK and the DIVCLK are aligned (that is, the signal UP and the signal DOWN appear at the same time), there will be net charges to the LPF, adjustment of the loop will cause the phases of the REFCLK and the DIVCLK are not aligned.

In FIG. 2, a signal UPB represents an inverse signal of the signal UP, and a signal DNB represents an inverse signal of the signal DN. The charge pump includes a plurality of transistors, which may be metal oxide semiconductor field effect (MOS) transistors in the embodiments illustrated in the present disclosure. The MOS transistors used in the charge pump of this example include N-channel MOS transistors (NMOS) and P-channel MOS transistors (PMOS), and the PMOS transistors are illustrated in the drawings with circle shapes at the gates.

Figure 4:
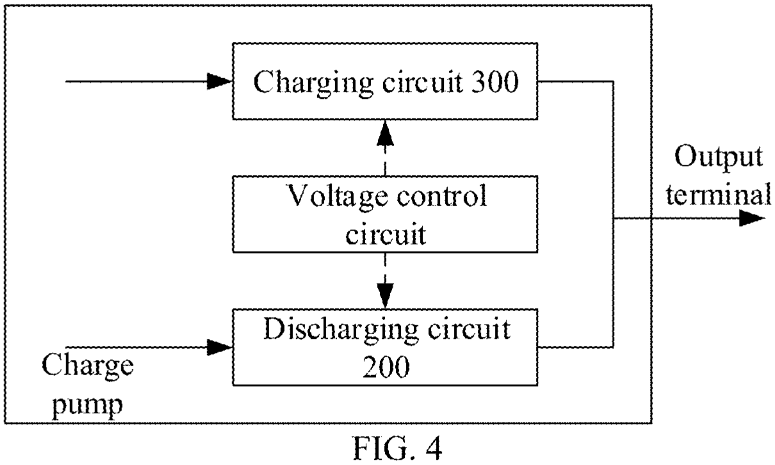
FIG. 4 is a schematic diagram of a structure of a charge pump according to an embodiment of the present disclosure.

An embodiment of the present disclosure provides a charge pump, as shown in FIG. 4, including a discharging circuit 200 and a charging circuit 300, both the discharging circuit 200 and the charging circuit 300 are connected to an output terminal of the charge pump, the discharging circuit 200 is configured to decrease a current of the output terminal under control of a first control signal, the charging circuit 300 is configured to increase the current of the output terminal under control of a second control signal, the first control signal and the second control signal correspond to error signals (e.g. the first control signal is the mentioned signal DN, and the second control signal is an inverse signal of the mentioned signal UP) between the two clock signals, and the charge pump further includes a voltage control circuit, wherein: the voltage control circuit connects a first node in the discharging circuit and/or a second node in the charging circuit to maintain the locked state of the phase-locked loop by controlling a corresponding node (a voltage of the first node and/or the second node); wherein both the first node and the second node are connected to the output terminal. That is, the voltage control circuit is configured to control the voltage of the first node in the discharging circuit and/or the voltage of the second node in the charging circuit so that a net charge output by the charge pump can maintain the locked state of the phase-locked loop when the first control signal and the second control signal indicate that there is no error between the two clock signals.

By controlling the voltage of the first node in the discharging circuit 200 and/or the voltage of the second node in the charging circuit 300, when the first control signal and the second control signal are aligned (arrive at the same time), that is, when the discharging circuit 200 and the charging circuit 300 work simultaneously, a difference between a charge current Iup and a discharge current Idn is 0 or approximately 0 (that is, the net current is 0 or approximately 0), that is, an output charge of the charge pump is 0 or approximately 0, thereby an linearity of the CP is improved, the charge pump can supply a long-term stable clock signal and reduce a possibility of lock losing of the phase-locked loop. The voltage control circuit adjusts turned-on speeds of the charging circuit and/or the discharging circuit so that the charging circuit and the discharging circuit are simultaneously turned on. For example, the voltage control circuit may control the voltage of the first node in the discharging circuit, so that a turned-on speed of the discharging circuit is close to a turned-on speed of the charging circuit, and when the discharging circuit and the charging circuit are simultaneously turned on, the net charge output by the charge pump is 0 or approximately 0. Alternatively, the voltage control circuit may control the voltage of the second node in the charging circuit, so that the turned-on speed of the charging circuit is close to the turned-on speed of the discharging circuit, and when the discharging circuit and the charging circuit are simultaneously turned on, the net charge output by the charge pump is 0 or approximately 0. Alternatively, the voltage control circuit may control the voltage of the first node in the discharging circuit and the voltage of the second node in the charging circuit, respectively, so that the charging circuit and the discharging circuit are simultaneously turned on. The term "simultaneously turned on" herein includes not only the charging circuit and the discharging circuit are turned on simultaneously, but also the charging circuit and the discharging circuit are turned on in a preset time period, as long as the charging circuit and the discharging circuit are turned on within a range of the preset time period and it can be ensured the phase-locked loop enters the locked state.

In an exemplary embodiment, the discharging circuit includes a first node (e.g., a node B in FIGS. 9 and 10) and a first switch transistor (e.g., a transistor M2 in FIGS. 9 and 10) positioned between the first node and the output terminal, the voltage control circuit includes a first control circuit connected to the first node, the first control circuit is configured to control a turned-on speed of the first switch transistor by controlling (e.g., adjusting) a voltage of the first node when the discharging circuit does not decrease the current of the output terminal under control of the first control signal (the first control signal is a DN signal in the examples of FIGS. 9 and 10), so that the discharging circuit and the charging circuit are turned on within a preset time period when the first control signal and the second control signal indicate that there is no error between the two clock signals. For example, the discharging circuit includes a discharge current branch from an output terminal of the charge pump to a ground terminal, and a first control circuit may be connected to the first node in the discharge current branch to adjust the voltage of the first node according to the first control signal when the discharging circuit is not discharged. Taking FIG. 2 as an example, since the discharge process is a process of the Idn from 0 to a maximum value, that is, a process in which the first node B discharges from the voltage VA-Vthm2 to close to 0, a turned-on speed of the transistor M2 in the discharge current branch can be controlled by controlling the voltage of the node B in advance, and the turned-on speed of the transistor M2 is the same or similar as the turned-on speed of the transistor M3 in the charging circuit by debugging the voltage of the node B, when the signal UP and the signal DN are aligned, a net charge output by the charge pump can be ensured to be 0 or approximately 0.

Figure 9:
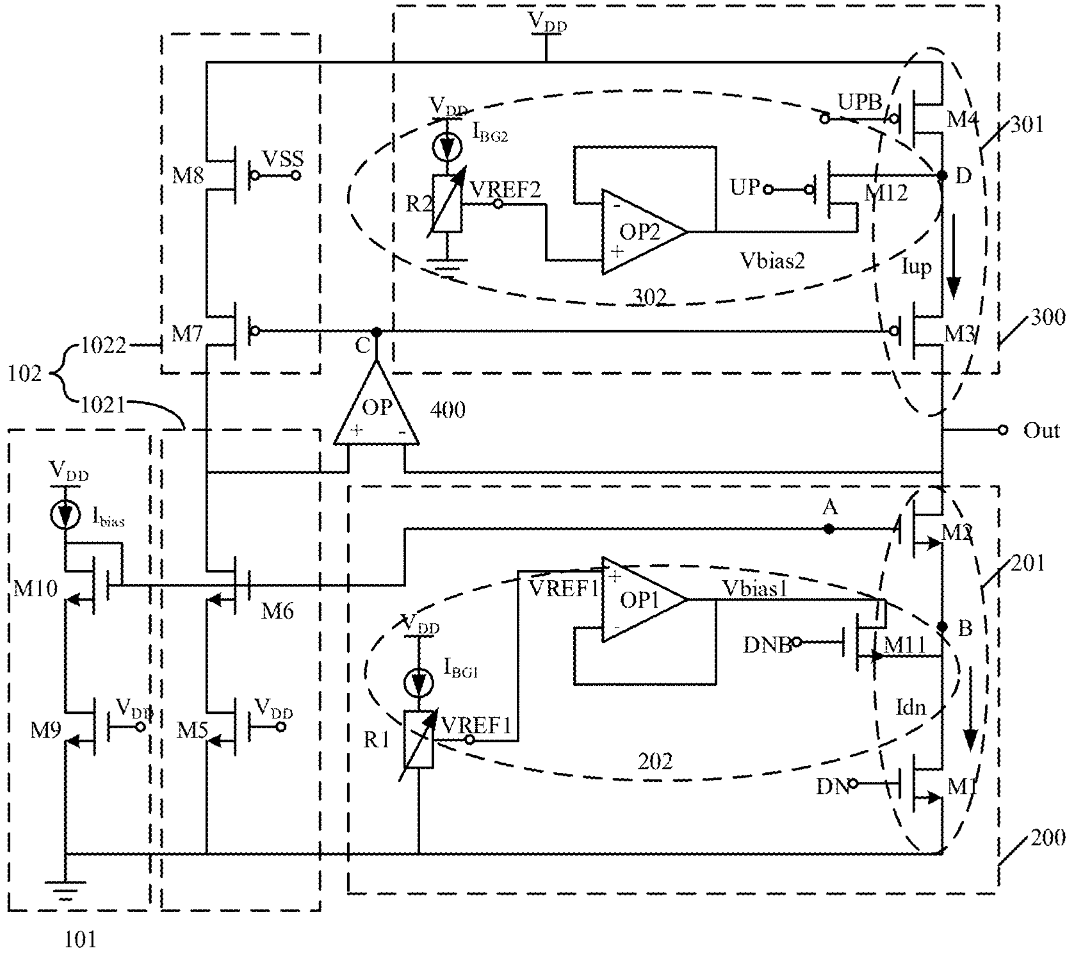
FIG. 9 is a schematic diagram of a circuit of another charge pump according to an embodiment of the present disclosure.
Figure 10:
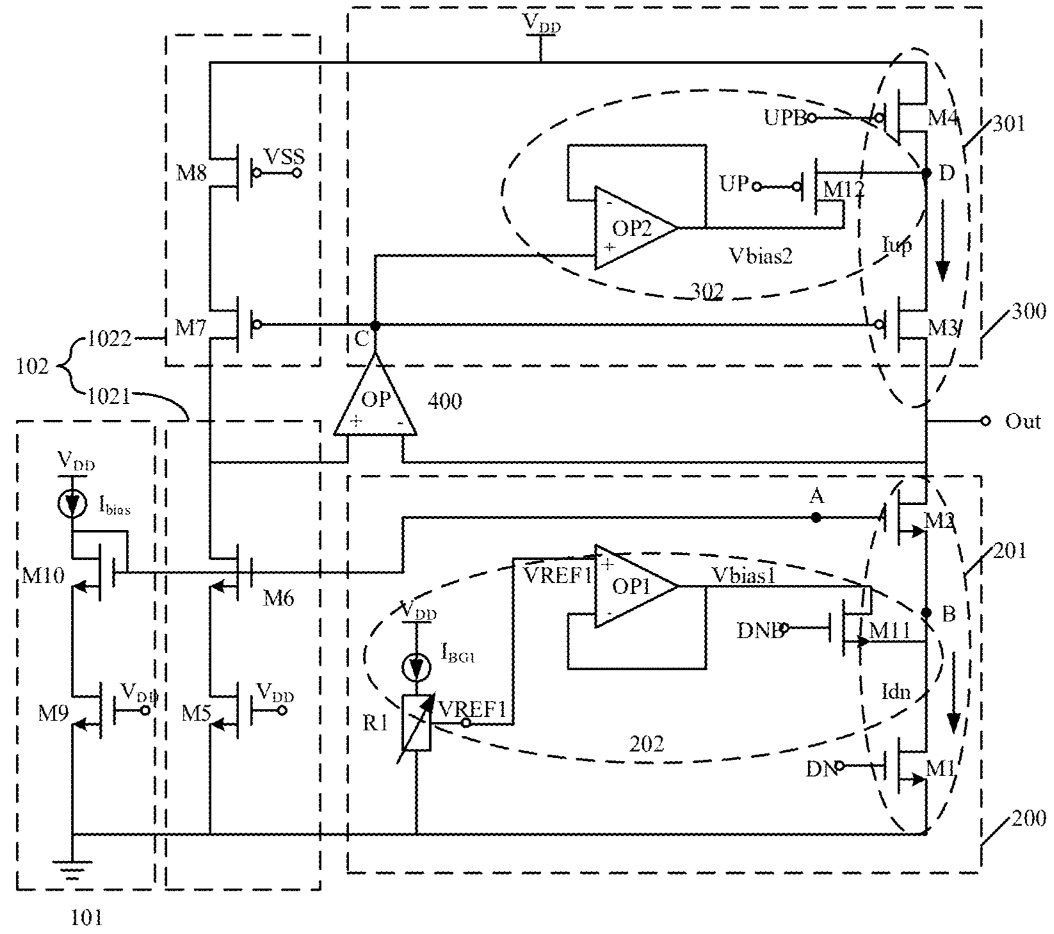
FIG. 10 is a schematic circuit diagram of a circuit of a yet another charge pump according to an embodiment of the present disclosure.

In an exemplary embodiment, the charging circuit includes a second node, and a second switch transistor (e.g. a transistor M3 in FIGS. 9 and 10) located between the second node (e.g. a node D in FIGS. 9 and 10) and the output terminal, the voltage control circuit includes a second control circuit connected to the second node, the second control circuit is configured to control a turned-on speed of the second switch transistor by controlling (e.g. adjusting) a voltage of the second node when the charging circuit does not increase the current of the output terminal under control of the second control signal (the second control signal is the aforementioned signal UPB in the examples of FIGS. 9 and 10), so that the discharging circuit and the charging circuit are turned on within a preset time period when the first control signal and the second control signal indicate that there is no error between the two clock signals. For example, for the charging circuit, the charging circuit includes a charge current branch from a power supply terminal to the output terminal of the charge pump, and a second control circuit may be connected to the second node in the charge current branch to adjust the voltage of the second node according to the second control signal when the charging circuit is not charged. Taking FIG. 2 as an example, since the charging process is a process of the Iup from 0 to a maximum value, that is, the voltage of the second node D is charged from a voltage smaller than VC+|Vthm3|to VDD, a turned-on speed of the transistor M3 in the charge current branch can be controlled by controlling the voltage of the node D in advance, and when the signal UP and the signal DN are aligned, a net charge output by the charge pump can be ensured to be 0 or approximately 0 by debugging the turned-on speed of the transistor M3 to be the same or similar as the turned-on speed of the transistor M2 in the discharging circuit.

Figure 5:
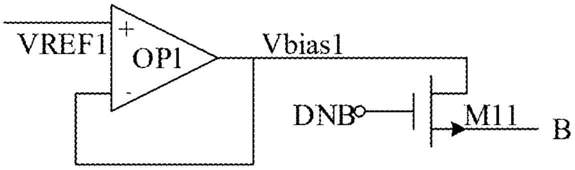
FIG. 5 is a schematic diagram of a first control circuit according to an embodiment of the present disclosure.

In an exemplary embodiment, in order to enable the first control circuit to control the voltage of the first node when the discharging circuit is not discharged under control of the first control signal, a control transistor as a switch may be provided in the first control circuit, and a control terminal of the control transistor is connected to the first control signal to enable the control transistor to be turned on when the discharging circuit does not work. Alternatively, a voltage may be supplied to the first control circuit through an external power source, or a charge buffer may be used as a container for storing charges to supply the voltage, and the charge buffer may be, such as an amplifier or a capacitor or the like, as a container for storing charges. For example, as shown in FIG. 5, the first control circuit may include a first charge buffer (the charge buffer is exemplified as an amplifier OP1 in FIG. 5) and a first control transistor M11 in series, the first charge buffer is configured to store charges, the first control transistor M11 acts as a switch, an input terminal of the first control transistor M11 is connected to an output terminal of the first charge buffer, an output terminal of the first control transistor M11 is connected to the first node (the node B in FIG. 5), a control terminal of the first control transistor M11 is configured to receive the first control signal (DNB in the drawings), and discharge the charges stored in the first charge buffer to the first node under control of this signal.

Figure 6:
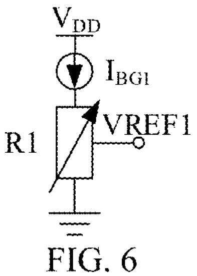
FIG. 6 is a schematic diagram of a circuit providing a VREF1 voltage according to an embodiment of the present disclosure.

Exemplarily, the first charge buffer may be supplied with a voltage using an external power source, or the voltage may be generated using a current source and a resistor. For example, as shown in FIG. 6, the first control circuit may further include a first current source $I_{BG1}$ (where BG represents a bandgap reference) and a first adjustable resistor R1 in series, the first charge buffer is exemplified as an first amplifier OP1, an input terminal of the first current source $I_{BG1}$ is connected to a power supply voltage terminal $V_{DD}$, an output terminal of the first current source $I_{BG1}$ is connected to a first terminal of the first adjustable resistor R1, and a second terminal of the first adjustable resistor R1 is connected to a ground terminal, a third terminal of the first adjustable resistor R1 (in this example, an effective resistance value of the first adjustable resistor R1 can be changed by adjusting a position of the third terminal) is connected to a first input terminal (i.e., a positive input terminal) of the first amplifier OP1 (as shown in FIG. 5) to supply an input voltage VREF1 of the first amplifier OP1, a second input terminal (a negative input terminal) of the first amplifier OP1 is connected to an output terminal of the first amplifier OP1, the output terminal of the first amplifier OP1 is connected to the input terminal of the first control transistor M11, and an output voltage of the first amplifier OP1 is the voltage of the first node (as Vbias1 shown in FIG. 5). In some embodiments, it may also be implemented with a common resistor instead of an adjustable resistor.

Figure 7:
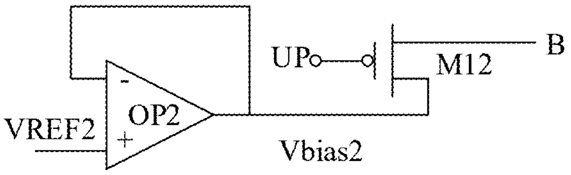
FIG. 7 is a schematic diagram of a second control circuit according to an embodiment of the present disclosure.

Similarly, in an exemplary embodiment, in order to enable the second control circuit to control the voltage of the first node when the charging circuit is not charged under control of the second control signal, a control transistor as a switch may be provided in the second control circuit, and a control terminal of the control transistor may be connected to the second control signal to enable the control transistor to be turned on when the charging circuit does not work (when the charging circuit is working, an inverse signal of the second control signal is received). Alternatively, a voltage may be supplied to the second control circuit through an external power source, or a charge buffer may be used as a container for storing charges to supply the voltage, and the charge buffer may be, such as an amplifier or a capacitor or the like, as a container for storing charges. For example, as shown in FIG. 7, the second control circuit may include a second charge buffer (the charge buffer is exemplified as an amplifier OP2 in FIG. 7) and a second control transistor M12 in series, the second charge buffer is configured to store charges, the second control transistor M12 acts as a switch, an input terminal of the second control transistor M12 is connected to an output terminal of the second charge buffer, an output terminal of the second control transistor M12 is connected to the second node (the node B in FIGS. 7 and 9), and a control terminal of the second control transistor M12 is configured to receive the second control signal (UP in the drawings), and discharge the charges stored in the second charge buffer to the second node under control of this signal.

Figure 8:
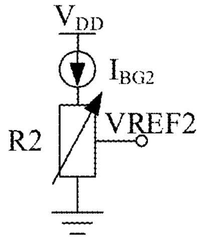
FIG. 8 is a schematic diagram of a circuit providing a VREF2 voltage according to an embodiment of the present disclosure.

Exemplarily, the second charge buffer may be supplied with a voltage using an external power supply source, or the voltage may be generated using a current source and a resistor. For example, as shown in FIG. 8, the second control circuit may further include a second current source $I_{BG2}$ and a second adjustable resistor R2 in series, the second charge buffer is exemplified as an second amplifier OP2, an input terminal of the second current source $I_{BG2}$ is connected to a power supply voltage terminal $V_{DD}$, an output terminal of the second current source $I_{BG2}$ is connected to a first terminal of the second adjustable resistor R2, and a second terminal of the second adjustable resistor R2 is connected to a ground terminal, a third terminal of the second adjustable resistor R2 (in this example, an effective resistance value of the second adjustable resistor R2 can be changed by adjusting a position of the third terminal) is connected to a first input terminal (i.e., a positive input terminal) of the second amplifier OP2 (as shown in FIG. 7) to supply an input voltage VREF2 of the second amplifier OP2, a second input terminal (a negative input terminal) of the second amplifier OP2 is connected to an output terminal of the second amplifier OP2, the output terminal of the second amplifier OP2 is connected to the input terminal of the second control transistor M12, and an output voltage of the second amplifier OP2 is the voltage of the second node (Vbias2 shown in FIG. 7). In some embodiments, it may also be implemented with a common resistor instead of an adjustable resistor.

It should be noted that, the first control signal may be a DN signal or a DNB signal as needed, and when the first control signal is a DN signal, the inverse signal of the first control signal is a DNB signal, and vice versa. Whether the control is performed by the first control signal itself or the control is performed by the inverse signal of the first control signal, it can be considered that the control is performed by the first control signal. The second control signal may be an UP signal or an UPB signal as needed, and when the second control signal is an UP signal, the inverse signal of the second control signal is an UPB signal, and vice versa. Similarly, whether the control is performed by the second control signal itself or the control is performed by the inverse signal of the second control signal, it is considered that the control is performed by the second control signal.

FIG. 9 is a schematic diagram of a circuit of a charge pump according to an embodiment of the present disclosure. The charge pump includes a discharging circuit 200 and a charging circuit 300, wherein the discharging circuit 200 includes a discharging current branch 201 and a first control circuit 202, and the charging circuit 300 includes a charging current branch 301 and a second control circuit 302.

In an exemplary embodiment of the present disclosure, the first control circuit 202 includes a first amplifier OP1 configured to store charges, and a first control transistor (an eleventh transistor M11 in the figure) in series, the first control transistor M11 acts as a switch, and an input terminal of the first control transistor M11 is connected to an output terminal of the first amplifier OP1, an output terminal of the first control transistor M11 is connected to the first node (node B in this example), a control terminal of the first control transistor is configured to receive the inverse signal DNB of the signal DN, and the first control transistor M11 is configured to under control of the control signal, discharge the charges stored in the first amplifier OP1 to the first node when the discharging current branch is not operating.

In this example, a circuit for supplying the charges to the first amplifier OP1 may include a first current source $I_{BG1}$ and a first adjustable resistor R1 in series, an input terminal of the first current source $I_{BG1}$ is connected to a power supply voltage terminal $V_{DD}$, an output terminal of the first current source $I_{BG1}$ is connected to a first terminal of the first adjustable resistor R1, a second terminal of the first adjustable resistor R1 is grounded, a third terminal of the first adjustable resistor R1 is connected to a positive input terminal of the first amplifier OP1, a negative input terminal of the first amplifier OP1 is connected to an output terminal of the first amplifier OP1, the output terminal of the first amplifier OP1 is connected to the input terminal of the first control transistor M11, the output terminal of the first control transistor M11 is connected to a node B, and a control terminal of the first control transistor M11 is configured to receive the inverse signal DNB of the signal DN.

The discharging current branch 201 includes a first transistor M1 and a second transistor M2 in series between the ground terminal and the output terminal Out of the charge pump.

The second control circuit 302 includes a second amplifier OP2 configured to store charges, and a second control transistor (a twelfth transistor M12 in the figure) in series, the second control transistor M12 acts as a switch, an input terminal of the second control transistor M12 is connected to an output terminal of the second amplifier OP2, an output terminal of the second control transistor M12 is connected to a second node (node D in this example), a control terminal of the second control transistor M12 is configured to receive the second control signal UP, and the second control transistor M12 is configured to discharge the charges stored in the second amplifier OP2 to the second node when the charging circuit is not charged, that is, when the charging current branch is not operating.

In this example, a circuit for supplying the charges to the second amplifier OP2 may include a second current source $I_{BG2}$ and a second adjustable resistor R2 in series, an input terminal of the second current source $I_{BG2}$ is connected to the power supply voltage terminal $V_{DD}$, an output terminal of the second current source $I_{BG2}$ is connected to a first terminal of the second adjustable resistor R2, a second terminal of the second adjustable resistor R2 is grounded, a third terminal of the second adjustable resistor R2 is connected to a positive input terminal of the second amplifier OP2, a negative input terminal of the second amplifier OP2 is connected to the output terminal of the second amplifier OP2, the output terminal of the second amplifier OP2 is connected to the input terminal of the second control transistor M12, the output terminal of the second control transistor M12 is connected to the node D, and the control terminal of the second control transistor M12 is configured to receive the second control signal UP.

The charging current branch 301 includes a third transistor M3 and a fourth transistor M4 in series between the output terminal Out of the charge pump and the power supply voltage terminal $V_{DD}$.

Transistor type included in the discharging current branch 201 is different from transistor type included in the charging current branch 301, and for example, the transistor type included in the charging current branch 301 is the PMOS transistor, and the transistor type included in the discharging current branch 201 is the NMOS transistor. The present disclosure is not limited thereto.

As shown in the figure, the charge pump further includes a current generation circuit. The current generation circuit includes a first current generation branch 101 and a second current generation branch 102. The first current generation branch 101 is configured to provide a mirror current to the second current generation branch 102, the second current generation branch 102 includes a first sub-branch 1021 and a second sub-branch 1022 in series, the first sub-branch 1021 and the discharging current branch 201 form a current mirror, and the second sub-branch 1022 and the charging current branch 301 form a current mirror.

In the following description, as an example, the transistors included in the charge current branch 301 are PMOS transistors, and the transistors included in the discharge current branch 201 are NMOS transistors. In the following example, taking the first control signal as DN, the inverse signal of the first control signal as DNB, the second control signal as UP, and the inverse signal of the second control signal as UPB as an example for explanation.

As shown in FIG. 9, the output terminal of the first transistor M1 is connected to the ground terminal, the input terminal of the first transistor M1 is connected to the output terminal of the second transistor M2, the control terminal of the first transistor M1 is configured to be input the first control signal DN, the input terminal of the second transistor M2 is connected to the output terminal Out of the charge pump, the control terminal of the second transistor M2 is connected to a first output terminal of a current generation branch (such as a first sub-branch 1021 of the second current generation branch 102).

The output terminal of the third transistor M3 is connected to the output terminal Out of the charge pump, the input terminal of the third transistor M3 is connected to the output terminal of the fourth transistor M4, the control terminal of the third transistor M3 is connected to the second output terminal of the current generation circuit (such as the second sub-branch 1022 of the second current generation branch 102), the input terminal of the fourth transistor M4 is connected to the power supply voltage terminal $V_{DD}$, and the control terminal of the fourth transistor M4 is configured to receive the inverse signal UPB of the signal UP.

The first current generation branch 101 includes a ninth transistor M9, a tenth transistor M10, and a current source Ibias in series between the ground terminal and the power supply voltage terminal $V_{DD}$. The second current generation branch 102 includes a fifth transistor M5, a sixth transistor M6, a seventh transistor M7, and an eighth transistor M8 in series between the ground terminal and the power supply voltage terminal $V_{DD}$. Among them, the first sub-branch 1021 includes a fifth transistor M5 and a sixth transistor M6 in series; and the second sub-branch 1022 includes a seventh transistor M7 and an eighth transistor M8 in series.

In an embodiment of the present disclosure, the ninth transistor M9, the tenth transistor M10, the fifth transistor M5, and the sixth transistor M6 are of the same type as the first transistor M1, and are, for example, NMOS transistors. The seventh transistor M7 and the eighth transistor M8 are of the same type as the third transistor M3, and are, for example, PMOS transistors. The present disclosure is not limited thereto.

In the first current generation branch 101, an output terminal of the ninth transistor M9 is connected to the ground terminal, an input terminal of the ninth transistor M9 is connected to an output terminal of the tenth transistor M10, and a control terminal of the ninth transistor M9 is connected to the power supply voltage terminal $V_{DD}$; an input terminal of the tenth transistor M10 is connected to a first terminal of a current source Ibias, and a control terminal of the tenth transistor M10 is connected to an input terminal of the tenth transistor M10. A second terminal of the current source Ibias is connected to a power supply voltage terminal $V_{DD}$.

In the first sub-branch 1021 of the second current generation branch 102, an output terminal of the fifth transistor M5 is connected to the ground terminal, an input terminal of the fifth transistor M5 is connected to an output terminal of the sixth transistor M6, a control terminal of the fifth transistor M5 is connected to the power supply voltage terminal $V_{DD}$, an input terminal of the sixth transistor M6 is connected to an output terminal of the seventh transistor M7, and a control terminal of the sixth transistor M6 is connected to the control terminal of the tenth transistor M10 and the control terminal of the second transistor M2.

In the second sub-branch 1022 of the second current generation branch 102, an input terminal of the seventh transistor M7 is connected to an output terminal of the eighth transistor M8, a control terminal of the seventh transistor M7 is connected to the control terminal of the third transistor M3, an input terminal of the eighth transistor M8 is connected to the power supply voltage terminal $V_{DD}$, and a control terminal of the eighth transistor M8 is grounded VSS.

In the following, taking the ninth transistor M9, the tenth transistor M10, the fifth transistor M5, and the sixth transistor M6, which are of the same type as the first transistor M1 and are all NMOS transistors, and the seventh transistor M7 and the eighth transistor M8, which are of the same type as the third transistor M3 and are all PMOS transistors, as an example, the operation process of the charge pump is described. In the embodiment of the present disclosure, the first current generation branch 101 can provide a mirror current to the second current generation branch 102, and the first sub-branch 1021 included in the second current generation branch 102 and the discharging current branch 201 form a current mirror (N current mirror) to provide a mirror current to the discharging current branch 201. Similarly, the second sub-branch 1022 included in the second current generation branch 102 and the charging current branch 301 form a current mirror (P current mirror) to provide a mirror current to the charging current branch 301.

In order to ensure that the charging current of the charge pump is equal to the discharging current of the charge pump when the phase-locked loop reaches the equilibrium state, as shown in the figure, the charge pump may further include: a comparator 400 (implemented by an operational amplifier OP in this example). A first input terminal (a negative input terminal) of the comparator 400 is connected to the output terminal Out of the charge pump, a second input terminal (a positive input terminal) of the comparator 400 is connected to the common terminal of the first sub-branch 1021 and the second sub-branch 1022, and an output terminal of the comparator 400 is connected to a control terminal of the third transistor M3, so that when the phase-locked loop reaches the equilibrium state, the charging current of the charge pump is equal to the discharging current of the charge pump, thereby ensuring a stable state of the phase-locked loop. For example, the comparator 400 may minimize a difference between the output current of the third transistor M3 and the output current of the second transistor M2 by making the voltage of the output terminal Out of the charge pump equal to the voltage of the node C, to minimize the static phase difference.

FIG. 10 is a schematic diagram of a circuit of a charge pump according to another embodiment of the present disclosure. The difference from the charge pump shown in FIG. 9 is that in this example, the second control circuit 302 may not include the second current source and the second adjustable resistor, and the voltage of the second amplifier OP2 is supplied by the comparator 400, that is, the second input terminal (the positive input terminal) of the second amplifier is connected to the output terminal of the comparator, or is connected to the control terminal of the third transistor M3 in the charging current branch.

As shown in FIG. 10, when the first control signal DN is at a high level, and the inverse signal DNB of the first control signal is at a low level, the first transistor M1 is turned on, the first control transistor M11 is turned off, and the N current mirror operates normally. When the first control signal DN is at a low level and the inverse signal DNB of the first control signal is at a high level, the first transistor M1 is turned off and the first control transistor M11 is turned on. At this time, a current generated by the first current source $I_{BG1}$ passes through the first resistor R1 to generate an adjustable reference voltage VREF1, VREF1 generates a voltage Vbias1 through a buffer composed of a first amplifier OP1, and the Vbias1 charges the node B through the first control transistor M11 to the Vbias1. When at a next time the first control signal DN will be at a high level and the inverse signal DNB of the first control signal will be at a low level, an initial voltage of the node B becomes the Vbias1. For the P-current mirror, it can be analyzed in the same way. When the second control signal UP is at a high level and the inverse signal UPB of the second control signal is at a low level, the fourth transistor M4 is turned on, the second control transistor M12 is turned off, and the P-current mirror operates normally. When the second control signal UP is at a low level and the inverse signal UPB of the second control signal is at a high level, the fourth transistor M4 is turned off, the third transistor M3 is turned off, the second control transistor M12 is turned on, the voltage of the node C is denoted as a voltage Vbias2 after passing through the buffer formed by OP2, and the Vbias2 charges the node D through the second control transistor M12, to enable the voltage of the node D to be equal to the Vbias2, that is, equal to the voltage of the node C, so that the VGS of the third transistor M3 is equal to 0. When at a next time the second control signal UP will be at a high level and the inverse signal UPB of the second control signal will be at a low level, the initial voltage of the node D becomes the Vbias2.

Figure 11A:
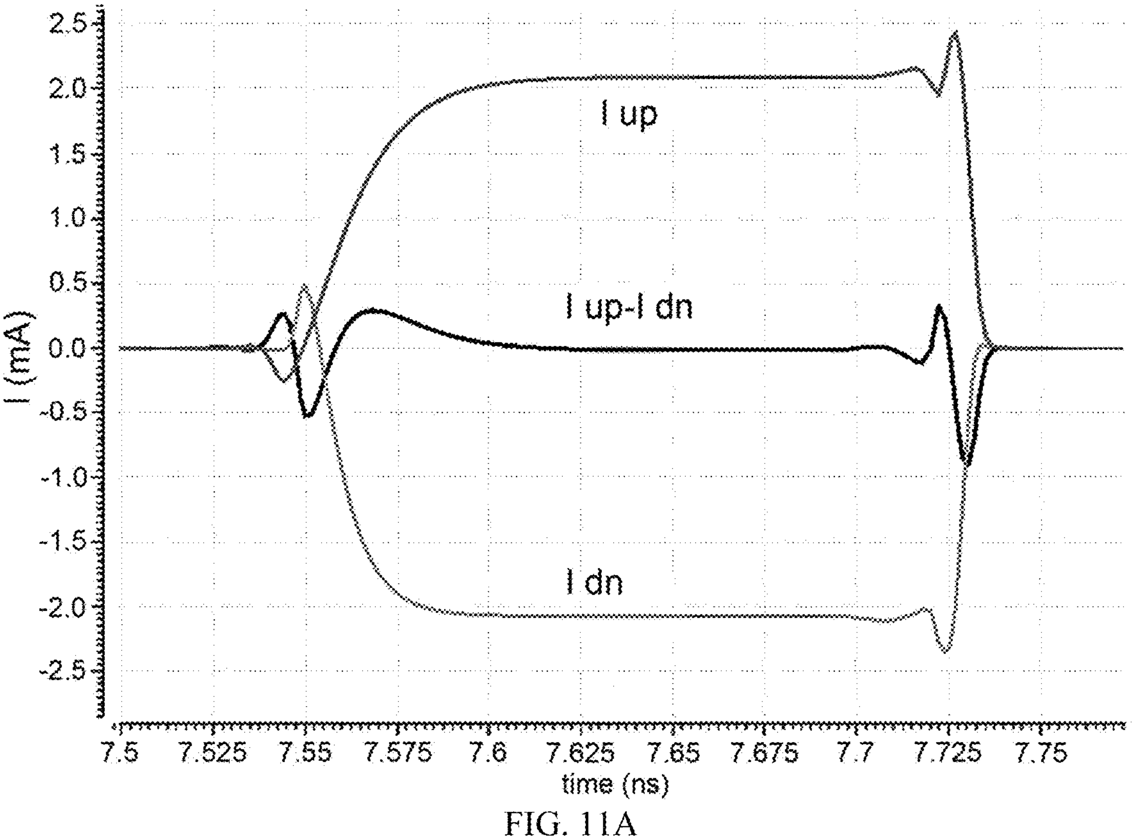
FIG. 11A is a schematic diagram of Iup, Idn and net current generated by the circuit shown in FIG. 10 at a VREF voltage.
Figure 11B:
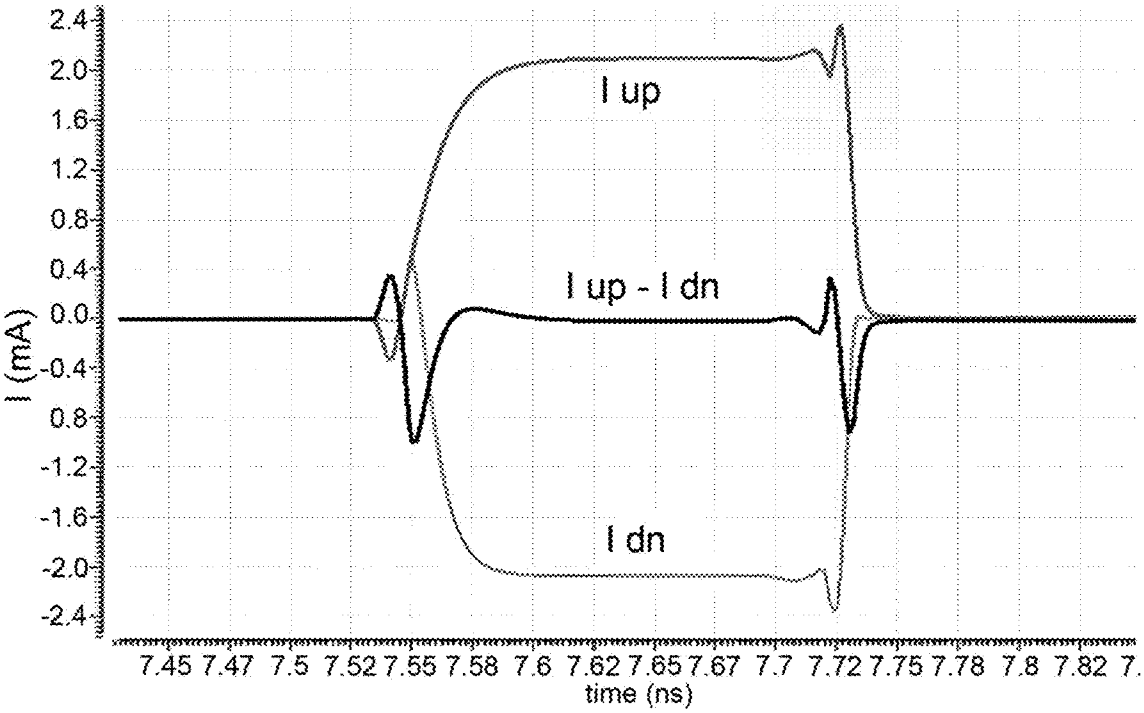
FIG. 11B is a schematic diagram of Iup, Idn, and net current generated by the circuit shown in FIG. 10 at another VREF voltage.

FIGS. 11A and 11B show the Iup, the Idn, and the net currents generated by the circuit shown in FIG. 10 at different VREF voltages. Net charges can be obtained by integrating the net current in one cycle. In FIG. 11A, the VREF voltage value is 450 mV, and the net charges are −29 f. In FIG. 11B, the VREF voltage value is 535 mV, and the net charges are −2 f. It can be seen that the net charges output by the CP when the two input clocks of PLL are aligned can be adjusted by adjusting the VREF voltage value.

As mentioned above, due to the influence of the semiconductor devices, the parasitic capacitance in a semiconductor device such as a switch or a power amplifier in the CP causes the CP to still have a current output when the PLL is locked, which causes the frequency of the oscillation signal output by the VCO to change, making the PLL easy to lose lock. For the signal transmitter that generates the FMCW signal using the PLL, this problem affects the linearity of frequency variation of the FMCW signal. For a system clock circuit that generates a clock signal using the PLL, this problem is not conducive to the requirement for a long-term stability of the clock signal.

Embodiments of the present disclosure also provide a phase-locked loop (abbreviated as a PLL). Taking a radar sensor as an example, the PLL is one of the important circuits in the radar sensor. A plurality of PLLs are included in the radar sensor, including a PLL for generating an FMCW signal, and a PLL for providing a clock signal to a digital circuit.

For the PLL for generating the FMCW signal, it includes a phase frequency detector PFD, a charge pump CP, a loop filter (low pass filter LPF), an oscillator (voltage control oscillator VCO), a divider DIV, and a modulator. The phase frequency detector PFD is respectively connected to an input terminal of the phase-locked loop and an output terminal of the divider (a first input terminal of the PFD is an input terminal of the phase-locked loop, and a second input terminal of the PFD is connected to an output terminal of the divider DIV) to receive two clock signals, and an output terminal of the phase frequency detector PFD is connected to an input terminal of the charge pump CP; an output terminal of the charge pump CP is connected to the input terminal of the loop filter (LPF), an output terminal of the loop filter (LPF) is connected to an input terminal of the oscillator (VCO), and an output terminal of the oscillator (VCO) is connected to an input terminal of the divider DIV; the modulator is connected to a control terminal of the divider DIV. The charge pump is the charge pump of any one of the preceding embodiments, such as, the charge pump of FIG. 4, FIG. 9, or FIG. 10, and is configured to maintain the locked state of the phase-locked loop.

In actual operation, a reference clock signal REFCLK is an input signal of the phase-locked loop, a frequency division signal DIVCLK is a feedback signal of the phase-locked loop, and Out is an output signal of the phase-locked loop. The phase frequency detector PFD and the charge pump CP are responsible for converting a phase difference between the signals REFCLK and DIVCLK into a current signal and outputting it to the loop filter LPF. The loop filter LPF converts the current signal into a voltage signal and filters out the high-frequency signal and then outputs it to the oscillator VCO. The oscillator VCO converts the voltage signal into a phase signal to output. The divider DIV performs frequency division on the phase signal output by the oscillator VCO according to a preset frequency ratio N (or a frequency division ratio). When the phase-locked loop is locked, there is: fout=fref*N, where fout is a frequency of the output signal, fref is a frequency of the reference clock signal, and different fouts can be obtained by changing different N values. In this embodiment, the modulator may change the value of N according to a certain rule with time, and output an adjustable frequency division ratio N, so that the phase-locked loop outputs a corresponding FMCW signal, and the divider converts the FMCW signal output by the phase-locked loop into one clock signal DIVCLK of the clock signals received by the phase frequency detector according to the adjustable frequency division ratio N.

In an exemplary embodiment, for a PLL for outputting a clock signal, it includes a phase frequency detector PFD, a charge pump CP, a loop filter LPF, an oscillator VCO, and a divider DIV. Different from the structure of the circuit of the PLL for generating the FMCW signal described above, the divider in this example performs frequency division operation according to a fixed N, so that the PLL outputs a clock signal with a stable frequency after locked, for example, the divider DIV converts the output signal fout of the phase-locked loop into one clock signal DIVCLK of the clock signals received by the phase frequency detector. The clock signal is used for digital circuits (such as MCU, data interface, CPU, memory, etc.) in the radar sensor to perform the following operations in time sequence: data processing, digital calculation, logic calculation, transmission or read and write operations, etc.

In another exemplary embodiment, for a phase-locked loop for generating the FMCW signal, the charge pump provided in this embodiment can significantly improve the linearity of the FMCW and effectively achieve a purpose of maintaining locking of the phase-locked loop within a bandwidth range. For a phase-locked loop for generating the clock signal, the charge pump of this scheme can provide a long-term stable clock signal and reduce a possibility of losing lock of the phase-locked loop.

Figure 12:
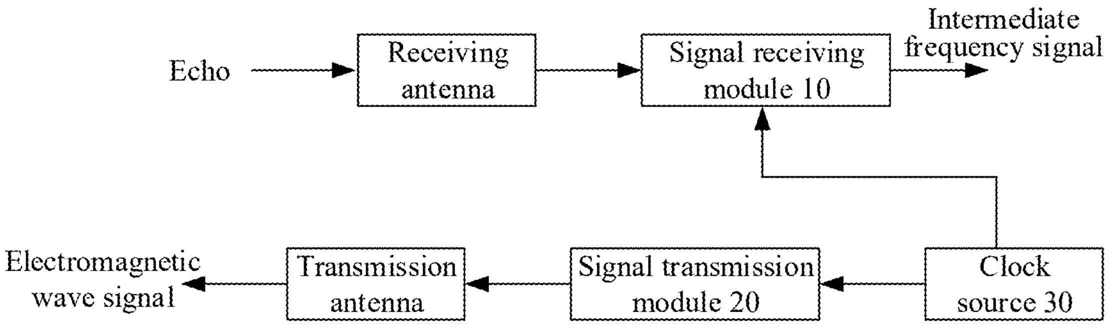
FIG. 12 is a schematic diagram of a structure of a radar sensor according to an embodiment of the present disclosure.

An embodiment of the present disclosure also provides a radar sensor, as shown in FIG. 12, including a signal receiving module (or a signal receiver) 10, a signal transmission module (or a signal transmitter) 20, and a clock source 30. The signal transmitter 20 is configured to receive an output signal (a clock signal) from the clock source 30 and transmit the output signal through a transmitting antenna to form a detection signal wave, and the clock source includes a phase-locked loop for generating an output signal. The signal receiver 10 is configured to receive an echo formed by reflection of the detection signal wave by a target object by using a receiving antenna, and to generate and output an intermediate frequency signal by performing a down conversion processing based on an output signal of the clock source 30; wherein the phase-locked loop is the phase-locked loop according to any one of the above embodiments.

Alternatively, in an exemplary embodiment of the present disclosure, the frequency modulated continuous wave signal is a millimeter wave signal, so that the electronic apparatus can be applied to fields such as autonomous driving, industrial automation, smart home appliances, and security inspection, and so on.

Figure 13:
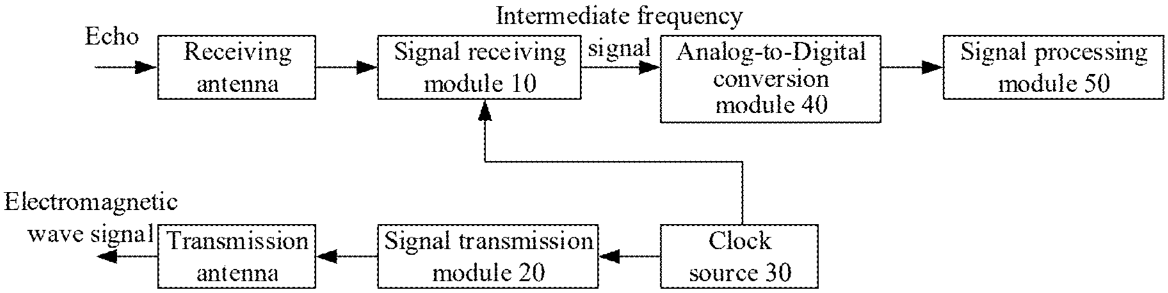
FIG. 13 is a schematic diagram of a structure of another radar sensor according to an embodiment of the present disclosure.

As shown in FIG. 13, in an exemplary embodiment, the radar sensor may further include an analog-to-digital conversion module 40 and a signal processing module 50. The signal receiver 10 generates and outputs an intermediate frequency signal to the analog-to-digital conversion module 40, then it is transmitted to the signal processing module 50 after being processed by the analog-to-digital conversion module 40, and signal processing is performed, by the signal process module 50, on the digital signal output by the analog-to-digital conversion module 40.

For example, the signal transmitter generates a chirp signal according to a preset continuous frequency modulation mode; a radio frequency transmission signal is obtained by a frequency doubling processing and fed to a transmitting antenna to transmit a corresponding detection signal wave. When the detection signal wave is reflected by an object, an echo signal wave is formed. The echo signal wave is converted into a radio frequency receiving signal by a receiving antenna. The signal receiver is configured to perform down-conversion, filtering, analog-to-digital conversion or the like processing on the radio frequency receiving signal using the radio frequency transmission signal to output a baseband digital signal representing a difference frequency between the detection signal wave and the echo signal wave. The signal processing module is configured to extract measurement information from the baseband digital signal by signal processing and output corresponding measurement data. Herein, the signal processing includes performing a digital signal processing calculation such as processing in phase, in frequency, or in time domain, etc., on at least one signal to be processed provided by at least one receiving antenna. The measurement data includes at least one of the following: distance data indicative of a relative distance from at least one detected object; velocity data indicative of the relative velocity from at least one detected object; and angle data indicative of the relative angle from at least one detected object, etc.

Alternatively, the frequency modulated continuous wave signal is a millimeter wave signal, the radar sensor may be an AiP millimeter wave radar chip with integrated antenna (s), and in some other embodiments of the present disclosure, the radar sensor may be another type of radar chip, and the present disclosure is not limited thereto.

In summary, in the phase-locked loop and the radar sensor according to the embodiments of the present disclosure, the frequency modulated continuous wave signal output by the phase-locked loop can have a good linearity, and can achieve the purpose of maintaining locking of the phase-locked loop within a bandwidth range, so that the performance of the radar system can be improved when the phase-locked loop or the radar sensor is applied to the radar system.

In an exemplary embodiment, an embodiment of the present disclosure further provides an electronic apparatus including the phase-locked loop or the radar sensor described above.

Exemplarily, the electronic apparatus includes: a apparatus body, and an electronic device such as a phase-locked loop or a radar sensor in the above embodiment provided on the apparatus body. Herein, the apparatus body is a structure which carries a radio device and is connected with the radio device via signals. The radio device can achieve functions such as target detection and/or communication within a range of beam scanning by transmitting and/or receiving the radio signals which are phase-shifted by the phaser, so as to provide target detection information and/or communication information to the apparatus body, and further assist in or even control the operation of the apparatus body.

In an alternative embodiment, the above electronic apparatus including the apparatus body and the above-mentioned at least one radio device may be a component or product applied to fields such as smart houses, transportation, smart homes, consumer electronics, monitoring, industrial automation, in-cabin detection and health care. For example, the apparatus body may be a smart transportation device (such as an automobile, bicycle, motorcycle, ship, subway, train, etc.), a security device (such as a camera), a liquid level/flow rate detection device, a smart wearable device (such as a bracelet, glasses, etc.), a smart home device (such as a sweeping robot, a door lock, a television, an air conditioner, a smart light, etc.), various communication devices (such as a mobile phone, a tablet computer, etc.), as well as a road gate, a smart traffic light, a smart sign, a traffic camera and various industrial mechanical arms (or robots), etc. The apparatus body may be various instruments for detecting vital signs parameters, or various devices equipped with the instruments, such as a device for detection in automobile cabins, a device for indoor personnel monitoring, an intelligent medical device, a consumer electronic device, etc.

From the foregoing, it will be appreciated that specific embodiments of the invention have been described herein for purposes of illustration, but that various modifications may be made without deviating from the scope of the invention. Accordingly, the invention is not limited except as by the appended claims.

What is claimed is:

1. A charge pump, applied in a phase-locked loop, wherein the phase-locked loop has a locked state, the charge pump comprises: a discharging circuit and a charging circuit, both the discharging circuit and the charging circuit are connected to an output terminal of the charge pump, the discharging circuit decreases a current of the output terminal under control of a first control signal, the charging circuit increases the current of the output terminal under control of a second control signal, the first control signal and the second control signal correspond to error signals between the two clock signals, and the charge pump further comprises a voltage control circuit, wherein:

the voltage control circuit is connected to a first node in the discharging circuit and/or a second node in the charging circuit to maintain the locked state of the phase-locked loop by controlling a voltage of a corresponding node; wherein both the first node and the second node are connected to the output terminal;

wherein the voltage control circuit adjusts turned-on speeds of the charging circuit and/or the discharging circuit such that the charging circuit and the discharging circuit are simultaneously turned on.

2. The charge pump according to claim 1, wherein the discharging circuit comprises the first node, and a first switch transistor positioned between the first node and the output terminal; and the voltage control circuit comprises a first control circuit connected to the first node, and the first control circuit controls a turned-on speed of the first switch transistor by adjusting a voltage of the first node when the discharging circuit does not decrease the current of the output terminal.

3. The charge pump according to claim 1, wherein the charging circuit comprises the second node, and a second switch transistor positioned between the second node and the output terminal; and the voltage control circuit comprises a second control circuit connected to the second node, and the second control circuit controls a turned-on speed of the second switch transistor by adjusting a voltage of the second node when the charging circuit does not increase the current of the output terminal.

4. The charge pump according to claim 3, wherein the first control circuit comprises a first charge buffer and a first control transistor in series, the first charge buffer stores charges, an input terminal of the first control transistor is connected to an output terminal of the first charge buffer, an output terminal of the first control transistor is connected to the first node, a control terminal of the first control transistor is configured to receive the first control signal, and the first control transistor acts as a switch to discharge the charges stored in the first charge buffer to the first node; and the second control circuit comprises a second charge buffer and a second control transistor in series, the second charge buffer stores charges, an input terminal of the second control transistor is connected to an output terminal of the second charge buffer, an output terminal of the second control transistor is connected to the second node, a control terminal of the second control transistor is configured to receive the second control signal, and the second control transistor acts as a switch to discharge the charges stored in the second charge buffer to the second node.

5. The charge pump according to claim 4, wherein the first control circuit further comprises a first current source and a first adjustable resistor in series, an input terminal of the first current source is connected to a power supply voltage terminal, an output terminal of the first current source is connected to a first terminal of the first adjustable resistor, a second terminal of the first adjustable resistor is connected to a ground terminal, a third terminal of the first adjustable resistor is connected to a first input terminal of the first charge buffer, a second input terminal of the first charge buffer is connected to the output terminal of the first charge buffer, and the output terminal of the first charge buffer is connected to the input terminal of the first control transistor; and the second control circuit further comprises a second current source and a second adjustable resistor in series, an input terminal of the second current source is connected to a power supply voltage terminal, an output terminal of the second current source is connected to a first terminal of the second adjustable resistor, a second terminal of the second adjustable resistor is connected to the ground terminal, a third terminal of the second adjustable resistor is connected to a first input terminal of the second charge buffer, a second input terminal of the second charge buffer is connected to the output terminal of the second charge buffer, and the output terminal of the second charge buffer is connected to the input terminal of the second control transistor.

6. The charge pump according to claim 1, wherein the voltage control circuit comprises a charge buffer and a control transistor in series, the charge buffer stores charges, and an input terminal of the control transistor is connected to an output terminal of the charge buffer;

an output terminal of the control transistor is connected to the first node, a control terminal of the control transistor is configured to receive the first control signal, and the control transistor acts as a switch to discharge the charges stored in the charge buffer to the first node; or an output terminal of the control transistor is connected to the second node, a control terminal of the control transistor is configured to receive the second control signal, and the control transistor acts as a switch to discharge the charges stored in the charge buffer to the second node.

7. The charge pump according to claim 6, wherein the voltage control circuit further comprises a current source and an adjustable resistor in series, an input terminal of the current source is connected to a power supply voltage terminal, an output terminal of the current source is connected to a first terminal of the adjustable resistor, a second terminal of the adjustable resistor is connected to a ground terminal, a third terminal of the adjustable resistor is connected to a first input terminal of the charge buffer, and a second input terminal of the charge buffer is connected to the output terminal of the charge buffer.

8. The charge pump according to claim 1, wherein net charges output by the charge pump during a locked period of the phase-locked loop are 0 or approximately 0.

9. A phase-locked loop, comprising a phase frequency detector, a charge pump, a loop filter, an oscillator, and a divider; wherein:

the phase frequency detector is respectively connected to an input terminal of the phase-locked loop and an output terminal of the divider to receive two clock signals, and an output terminal of the phase frequency detector is connected to an input terminal of the charge pump; an output terminal of the charge pump is connected to an input terminal of the loop filter, an output terminal of the loop filter is connected to an input terminal of the oscillator, and an output terminal of the oscillator is connected to an input terminal of the divider;

wherein the charge pump comprises the charge pump according to claim 1.

10. The phase-locked loop according to claim 9, wherein the divider converts an output signal fout of the phase-locked loop into one clock signal DIVCLK of clock signals received by the phase frequency detector according to a fixed frequency division ratio N; or the divider is connected to a modulator to convert an FMCW signal output by the phase-locked loop into one clock signal DIVCLK of clock signals received by the phase frequency detector by using an adjustable frequency division ratio N output by the modulator;

wherein the charge pump is configured to maintain a locked state of the phase-locked loop during operation of either divider.

11. A radar sensor, comprising a signal receiver, a signal transmitter, and a clock source, wherein the signal transmitter receives an output signal from the clock source, and transmits the output signal through a transmitting antenna to form a detection signal wave;

the signal receiver receives an echo formed by reflection of the detection signal wave by a target object by using a receiving antenna, and performs a down conversion processing on the echo to output an intermediate frequency signal; wherein the clock source comprises the phase-locked loop according to claim 9, to generate the output signal.

12. An electronic apparatus, comprising the phase-locked loop according to claim 9.

13. The charge pump according to claim 2, wherein the charging circuit comprises the second node, and a second switch transistor positioned between the second node and the output terminal; and the voltage control circuit comprises a second control circuit connected to the second node, and the second control circuit controls a turned-on speed of the second switch transistor by adjusting a voltage of the second node when the charging circuit does not increase the current of the output terminal.

14. The charge pump according to claim 13, wherein a transistor type of the first switch transistor is different from that of the second switch transistor.

15. The charge pump according to claim 4, wherein the first charge buffer is an amplifier or a capacitor, and the second charge buffer is an amplifier or a capacitor.

16. The charge pump according to claim 3, wherein the charge pump further comprises a comparator, a first input terminal of the comparator is connected to the output terminal of the charge pump, and an output terminal of the comparator is connected to a control terminal of the second switch transistor.

17. An electronic apparatus, comprising the radar sensor according to claim 11.

* * * * *